(12) United States Patent
Caley et al.

(10) Patent No.: US 9,535,157 B2
(45) Date of Patent: Jan. 3, 2017

(54) PROXIMITY SENSOR INCLUDING REFERENCE DETECTOR FOR STRAY RADIATION DETECTION

(71) Applicants: STMicroelectronics (Research & Development) Limited, Marlow, Buckinghamshire (GB); STMicroelectronics (Grenoble 2) SAS, Grenoble (FR); STMicroelectronics (Crolles 2) SAS, Crolles (FR)

(72) Inventors: Adam Caley, Fife (GB); Pierre-Jean Parodi-Keravec, Edinburgh (GB); Olivier Le Briz, Saint-Gervais (FR); Sandrine Lhostis, Theys (FR)

(73) Assignees: STMicroelectronics (Research & Development) Limited, Marlow (GB); STMicroelectronics (Grenoble 2) SAS, Grenoble (FR); STMicroelectronics (Crolles 2) SAS, Crolles (FR)

( * ) Notice: Subject to any disclaimer, the term of this patent is extended or adjusted under 35 U.S.C. 154(b) by 151 days.

(21) Appl. No.: 14/493,553

(22) Filed: Sep. 23, 2014

(65) Prior Publication Data

US 2015/0083900 A1 Mar. 26, 2015

(30) Foreign Application Priority Data

Sep. 24, 2013 (GB) .................................. 1316965.1

(51) Int. Cl.
*G01S 7/481* (2006.01)
*G01S 17/02* (2006.01)
(Continued)

(52) U.S. Cl.
CPC .............. *G01S 7/4811* (2013.01); *G01S 7/497* (2013.01); *G01S 17/026* (2013.01); *G01S 17/36* (2013.01)

(58) Field of Classification Search
USPC .............. 250/221, 231.1, 549; 345/173–178; 340/545.3, 555–557
See application file for complete search history.

(56) References Cited

U.S. PATENT DOCUMENTS 5,633,527 A * 5/1997 Lear ................... G02B 6/12004
257/101
2001/0015992 A1* 8/2001 Kimizuka ........... H01S 5/02248
372/50.21

(Continued)

FOREIGN PATENT DOCUMENTS

EP 0801448 A2 10/1997
GB 2494479 A 3/2013
WO WO-2009046717 A2 4/2009

OTHER PUBLICATIONS

UK—IPO Search Report for GB1316965.1 dated Mar. 7, 2014 (4 pages).

*Primary Examiner* — Renee Chavez
(74) *Attorney, Agent, or Firm* — Gardere Wynne Sewell, LLP

(57) ABSTRACT

A proximity sensor includes a radiation source configured to emit a primary radiation beam and a primary detector configured to pick up a reflected primary radiation beam. The radiation source is further configured to emit stray radiation. The sensor further includes a reference detector arranged to receive the stray radiation. The stray radiation may, for example, be emitted from either a side of the radiation source or a bottom of the radiation source.

19 Claims, 7 Drawing Sheets

(51) Int. Cl.
G01S 17/36 (2006.01)
G01S 7/497 (2006.01)

(56) References Cited

U.S. PATENT DOCUMENTS

2009/0097010 A1    4/2009    Yamaguchi
2011/0220779 A1*  9/2011    Takaoka .............. H01S 5/02284
                                                                         250/216

\* cited by examiner

PROXIMITY SENSOR INCLUDING REFERENCE DETECTOR FOR STRAY RADIATION DETECTION

PRIORITY CLAIM

This application claims priority from United Kingdom Application for Patent No. 1316965.1 filed Sep. 24, 2013, the disclosure of which is incorporated by reference.

TECHNICAL FIELD

The present disclosure relates to improvements in or relating to proximity sensors, and in particular to proximity sensors of a type comprising a radiation source for emitting a beam and a detector for detecting the beam after it is reflected from an object in view of the sensor; and to a new radiation source.

BACKGROUND

The general principle of a sensor of this type is illustrated in FIG. 1. The proximity sensor 100 comprises radiation source 102 and radiation detector 104. The radiation source 102 emits radiation which is reflected from an object 106 and picked up by detector 104. The detector 104 may also be provided with other circuitry provided as part of the detector 104 or associated therewith, which analyzes the output from the detector 104 for a proximity sensing calculation.

The proximity sensor 100 may also be provided with a reference detector 108. This is arranged close to the radiation source 102, such that it does not receive any parasitic (unwanted) light that is reflected from the object 106. In order to switch the radiation sensor to emit radiation, an electrical signal must be applied. This is achieved by the switching of control circuitry connected to the radiation source, connected via bond pads to a substrate such as a printed circuit board (PCB). The timing of the control signal is well known and measureable. However, there is a delay between the control signal being applied and the actual output of the radiation from the source 102. This delay can cause error in a time of flight based distance measurement. The reference detector 108 detects radiation generated when the actual output of radiation from the source 102 occurs, so that the offset between the control signal being applied and the actual emission of the radiation can be measured and taken account of in a time of flight calculation.

In order to provide an effective measurement of the time of radiation emission, the reference detector 108 must be positioned in the direct path of the main beam of the radiation detector, or part of the main beam must be reflected back on to the reference detector 108. Either of these options reduces the amount of radiation that is available for transmission and subsequent reflection from an object, thus reducing the accuracy and/or the effective range of the proximity sensor. It is therefore desired to improve the accuracy of the operation of the reference detector.

FIG. 2 shows a plan view of the sensor 100 showing the radiator 102, the detector 104 and reference detector 108. As can be seen here, the reference detector 108 and the radiation source 102 both take up space on the die. A typical module size of a proximity sensor package might for example comprise a length of 5-6 mm and a breadth of 3-3.5 mm. The radiation source may take up 1-2 mm of the package length. It is to be appreciated that these exemplary dimensions are mentioned for the purposes of illustration only. Actual dimensions could vary. In any event, the reference detector 108 is also provided as a separate component taking up further space on the die. It is desired to use proximity sensors of this type in various applications that require the sensor to be as small as possible; for example, for incorporation into mobile telephones and other portable electronic devices. It is therefore highly desirable to reduce the package size of a proximity sensor of the type that comprises a radiation source, a detector and a reference array.

SUMMARY

According to a first aspect of the disclosure, there is provided a proximity sensor of the type comprising a radiation source for emitting a primary radiation beam and a primary detector for picking up a reflected primary radiation beam; said sensor comprising a reference detector arranged to receive stray radiation emitted from the radiation source.

Optionally, the radiation source comprises a vertical cavity surface emitting laser (VCSEL) comprising a first mirror and a second mirror provided at respective upper and lower sides of an active layer.

Optionally, the radiation source is mounted on an underlying substrate which carries the reference detector.

Optionally, a conductive material is provided to affix the radiation source to the underlying substrate which carries the reference detector, said conductive material being formed to provide an electrical coupling between the radiation source and a bond pad which is carried on the underlying substrate.

The radiation source will typically comprise a cathode and an anode, each of which is electrically coupled to an electrical connector, such as a bond pad, on an underlying substrate.

Optionally, the reference detector is co-located with the radiation source to receive back emission stray radiation.

The reference detector may be provided at a position directly underneath a radiation source.

Optionally, the radiation source also comprises an at least partially transparent substrate.

Optionally a transparent glue is provided to affix the radiation source to an underlying substrate which carries the reference detector.

Optionally, a second mirror of the radiation source is designed to have a lower than 100% reflectivity in order to encourage back emission stray radiation.

Optionally, the radiation source is provided with a first electrode at an upper surface, and a second electrode at a lower surface, said second electrode being formed from an optically transparent material.

An example of a suitable optically transparent material is indium tin oxide (ITO).

Alternatively, the radiation source is provided with a first electrode at an upper surface, and a second electrode at a lower surface, said second electrode being shaped to have a transparent portion.

Optionally, said second electrode has an annular shape.

Optionally, the sensor comprises a collection means for collecting side emission stray radiation and directing it towards the reference detector.

Optionally, said collection means comprises an optically conductive material that is formed around a side portion of the radiation sensor.

Optionally, said collection means comprises an opaque outer shield member, which optionally has a reflective underside surface.

Optionally, the radiation source comprises an active portion for emitting a primary radiation beam and an extended portion.

Optionally, a shield member is molded around the extended portion, including a portion on an upper surface of the extended portion.

The collection means is by this arrangement particularly suited to collecting stray radiation that is side emitted from the radiation source, including for example side emissions from the active layer.

Optionally, the radiation source comprises a light emitting diode (LED).

According to a second aspect of the disclosure, there is provided an electronic device comprising a proximity sensor of the type comprising a radiation source for emitting a primary radiation beam and a primary detector for picking up a reflected primary radiation beam; said sensor comprising a reference detector arranged to receive stray radiation emitted from the radiation source.

The electronic device may comprise a mobile telephone, a laptop or portable rangefinder for example.

According to a third aspect of the disclosure, there is provided a radiation source for emitting a primary radiation beam from an upper surface thereof, comprising a first mirror and a second mirror provided at respective upper and lower sides of an active layer, and wherein the reflectivity of said first and second mirrors permits back emission of radiation.

Optionally, the radiation source comprises a vertical cavity surface emitting laser (VCSEL).

Optionally, the second mirror is designed to have a reflectivity of less than 100%.

Optionally, a reflectivity of the first mirror is less than the reflectivity of the second mirror.

Optionally, the radiation source further comprises an at least partially transparent substrate upon which said first mirror, active layer and second mirror are provided.

Optionally, an electrode is provided beneath a structure comprising said first mirror, active layer and second mirror Optionally, the electrode is formed of a material that is both transparent and electrically conductive.

Alternatively, the electrode is shaped to include an aperture or a transparent portion.

Optionally, the radiation source comprises a light emitting diode (LED).

BRIEF DESCRIPTION OF THE DRAWINGS

The present disclosure will now be described, by way of example only, with reference to the accompanying drawings in which.

DETAILED DESCRIPTION OF THE DRAWINGS

Figure 1:
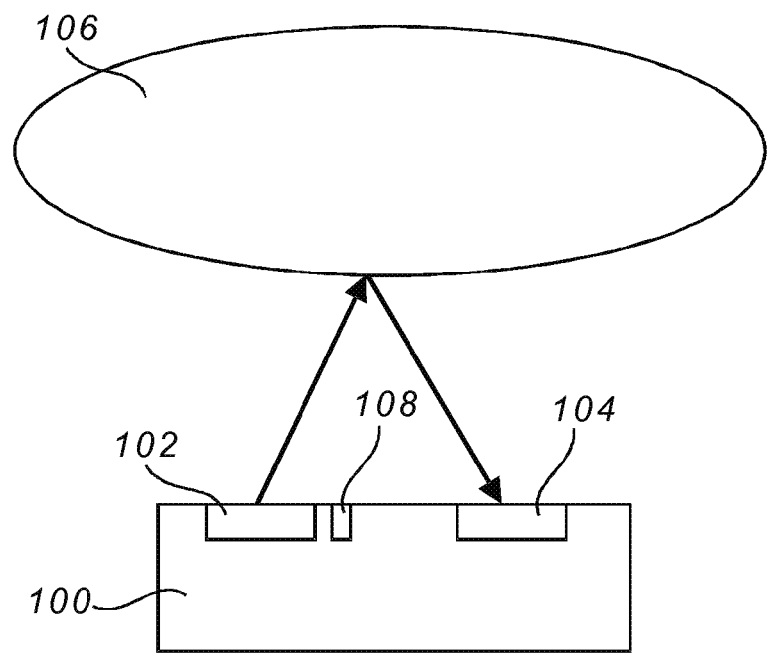
FIG. 1 illustrates the principle of operation of a proximity sensor.
Figure 2:
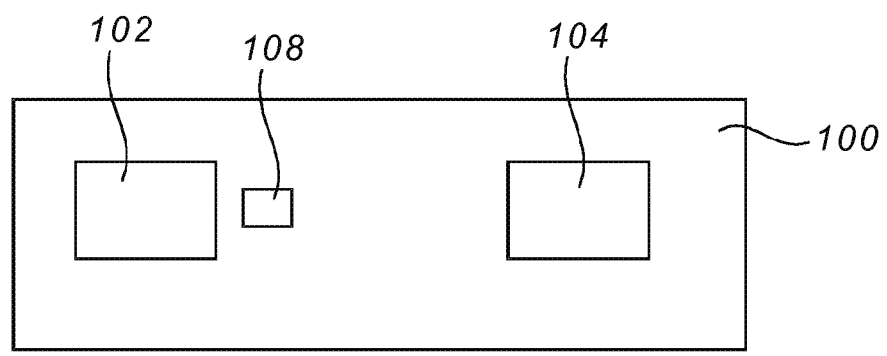
FIG. 2 is a schematic plan view of the sensor illustrated in FIG. 1.

Proximity sensing using the type of sensor illustrated in FIGS. 1 and 2 may be carried out based on a time of flight algorithm or a phase extraction algorithm. These methods yield a quantitative measurement of the distance of an object from the sensor package.

The direct time of flight (TOF) method may for example use a narrow pulsed laser as the radiation source, with a time-digital converter (TDC) being provided for measuring the difference in time between transmission and first photon reception. Commonly, a 'reverse mode' is employed, where the TDC measures the time from first photon reception to next pulse transmission. This scheme minimizes system activity to only the occasions where a photon is detected, and is therefore well matched to tightly controlled, low photon flux levels.

The phase extraction method measures the phase of the radiation incident on the detector 104. The phase shift between the radiation waveforms transmitted by the radiation source 102 and received at the detector 104 is indicative of the distance travelled by the radiation.

There are many different types of radiation source that may be used as the radiation source 102 of the proximity sensor 100. Two example types of radiation sources that may be used are a light emitting diode (LED) or a vertical cavity surface emitting laser (VCSEL). The disclosure can apply to any type of radiation source.

Similarly, there are many different types of detectors that can be used as the main detector 104 and the reference detector 108. The disclosure can apply to any type of detector. For example, either detector may comprise a digital image sensor comprising an array of pixels which may, for example, comprise a charge coupled device (CCD) array or an array of pixels manufactured according to complementary metal oxide semiconductor (CMOS) techniques. Another example type of detector that can be provided is a single photon avalanche diode (SPAD), which can also be manufactured in a CMOS process. A SPAD is based on a p-n junction device biased beyond its breakdown region. The high reverse bias voltage generates a sufficient magnitude of electric field such that a single charge carrier introduced into the depletion layer of the device can cause a self-sustaining avalanche via impact ionization. The avalanche is quenched, either actively or passively to allow the device to be "reset" to detect further photons. The initiating charge carrier can be photo-electrically generated by means of a single incident photon striking the high field region. It is this feature which gives rise to the name 'Single Photon Avalanche Diode'.

This single photon detection mode of operation is often referred to as 'Geiger Mode'.

The radiation source 102 may also emit radiation in other wavelength bands other than infrared or near infrared. The disclosure can apply to any radiation wavelength.

The sensor package is tested once the final assembly is complete. Though the individual components may undergo some initial testing, many handling steps are performed on them before further testing is possible. The ability to confirm that the VCSEL and the substrate having the detectors still show some functionality would allow economies in the manufacturing process by eliminating 'bad' components early and provide improved means of controlling the manufacturing processes.

Figure 3:
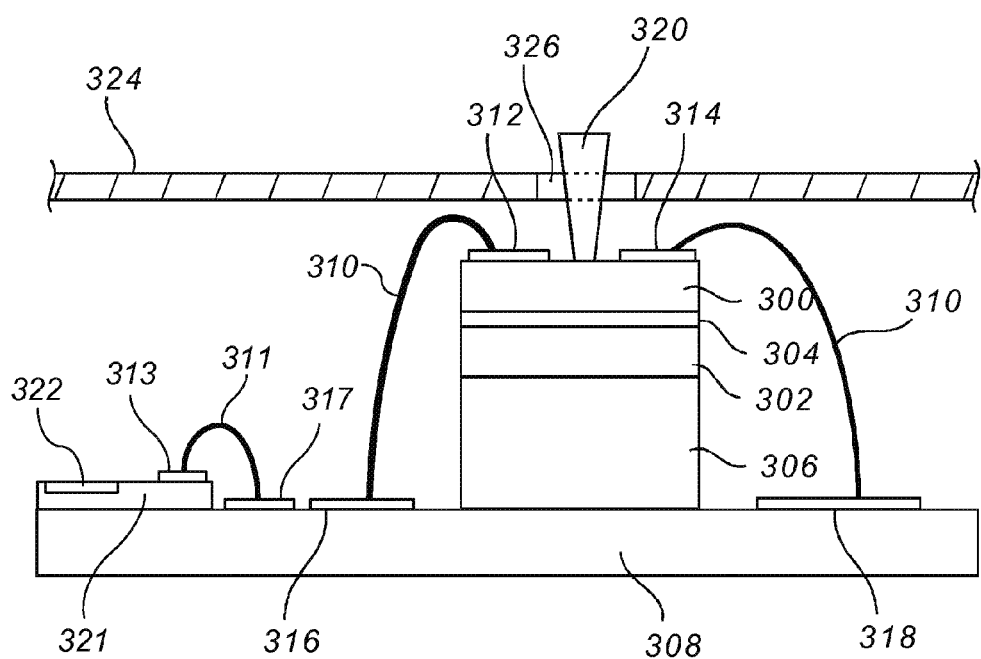
FIG. 3 is a schematic diagram illustrating the structure of a VCSEL and reference detector which may be incorporated as part of the proximity sensors shown in FIGS. 1 and 2.

FIG. 3 illustrates an example proximity sensor comprising a VCSEL and a reference detector 322 formed from a photodiode based CMOS pixel array.

The VCSEL comprises a first mirror 300 and a second mirror 302 either side of an active layer 304. The active layer 304 will usually, but does not have to, extend across the entire width or breadth of the structure (the same comment applies to active layers of subsequent diagrams). The first and second mirrors 300, 302 may comprise structures with multiple layers, such as distributed Bragg reflectors which comprise alternating layers of relatively high and relatively low refractive index materials (for example, sequential GaAs (Gallium-Arsenide) and AlGaAs (Aluminum-Gallium-Arsenide) layers) which provide constructive interference between reflected waves having a wavelength of four times the optical thickness of the reflector layers, thus providing a very high reflectivity, typically well above 99% and close to 100%. The top and bottom mirrors 300, 302 may be oppositely doped, so that the mirrors 300, 302 together with the active layer 604 form a p-i-n junction. The active layer 304 may comprise a quantum well. The VCSEL is housed within a package that comprises an opaque cover member 324 with a transparent portion 326. The transparent portion 326 may be an aperture formed through the cover member or it may be a transparent portion of the cover 324.

The lower (or "back") mirror 302 is made to be as reflective as possible. In the present disclosure, a mirror having "100% reflectivity" is used to mean a mirror that is formed to have a reflectivity that is as close to 100% as is practicably possible.

The upper mirror 300 will have a reflectivity of less than 100%. The actual reflectivity is tuned according to the structure of the laser and the desired light output. For example, which is not intended to limit the scope of the present disclosure, reflectivity at or around 97% may be used.

The mirror layers 300, 302 are mounted on an opaque substrate 306 provided on an underlying substrate 308 which may for example be a printed circuit board made of FR-4 glass-reinforced epoxy laminate. Only a part of the overall substrate 308 is shown in FIG. 3. The VCSEL is electrically connected to the substrate 308 via bond wires 310, which couple a cathode 312 and an anode 314 to bond pads 316, 318 provided on the substrate 308. The VCSEL structure emits a light beam 320 when activated.

A die 321 is mounted on substrate 308. The die 321 may be a proximity detector die that comprises both the detector 104 (not shown) and the reference detector 322. The reference detector is electrically connected to the substrate via a bond wire 311 (only one is shown, but there are typically more than one). The bond wire 311 couples a bond pad 313 on the die 321 to a bond pad 317 on the substrate 308. The reference detector 322 is provided for detecting light reflected from the underside of the cover 324 which, as mentioned above, can be used for calibrating the detector 104. The main beam 320 will have a maximum intensity of radiation within the cone illustrated in the figure. However there will necessarily be some radiation emitted outside the cone of the main intensity region, which will be reflected by the underside surface of the cover 324 and be incident on the reference detector 322.

It can be seen that that the reference detector 322 and the VCSEL structure are provided side by side, each taking up space on the substrate 308. Furthermore, because the reference detector 322 receives only reflections from the underside surface of the cover 324 it will receive a relatively weak signal which increases the chance of the reference detector 322 malfunctioning. Also, there is a large part to part variation in the amount of light that reaches the reference detector 322, which further reduces the reliability of detection.

A radiation source is designed to emit radiation having controlled characteristics, making use of an emission mechanism. The controlled characteristics of radiation may for example to emit a beam of radiation having predetermined parameters such as wavelength, coherence and optical power in a given direction of radiation. In an ideal case, radiation will be emitted only according the specific emission mechanism of the radiation source and having the controlled characteristics as designed.

However, the controlled characteristics cannot in practice be perfectly obtained. For example, instead of emitting radiation having a single wavelength, the actual wavelength emitted might contain a spread of wavelengths around the desired output wavelength; the beam might diverge away from the ideal shape, and the optical power may vary from the ideal optical power output over time or with different operating conditions, such as temperature for example. These various factors are termed as emission aberrations.

In addition, radiation can be emitted via other mechanisms asides from the main emission mechanism, or from various side effects of the main emission mechanism. That is, in the performance of the emission mechanism of the radiation sensor various other types of emission apart from the main beam occur because of various side effects and other emission mechanisms. This is termed herein as "stray illumination".

As an example, a main beam of a VCSEL is emitted from an upper surface of the VCSEL and has a predetermined dominant wavelength, which is determined by the design of the VCSEL. The primary purpose of the VCSEL is to emit the main beam. However, radiation may also be emitted from the sides of the structure, from various layers, including in particular the active layer. This is referred to as side emission. Radiation may also be emitted from the rear of a VCSEL structure. A bottom mirror is designed to have 100% reflectivity but this is not achievable in practice, so there will be some emission in a backwards (downwards) direction, referred to as back emission.

Side emission and back emission are two examples of stray radiation in the context of a VCSEL, and also in other vertically emitting radiation sources, such as light emitting diodes for example. Side and back emission are termed as stray radiation because they represent radiation in directions other than the main direction of radiation for which a conventional radiation source is designed. Mere divergence of a main beam does not represent a "direction other than" the main direction of the radiation for which a conventional radiation source is designed.

Stray radiation may be of a different wavelength from the main beam, and indeed will normally comprise a relatively large spread of wavelengths.

The present disclosure provides for a proximity sensor having a reference detector that uses stray radiation from the radiation source to provide a reference signal for establishing the accurate time of emission of radiation after a radiation source is switched on. There are two main aspects to this. The first is the use of back emission stray radiation, and the second is the use of side emission stray radiation.

Figure 4A:
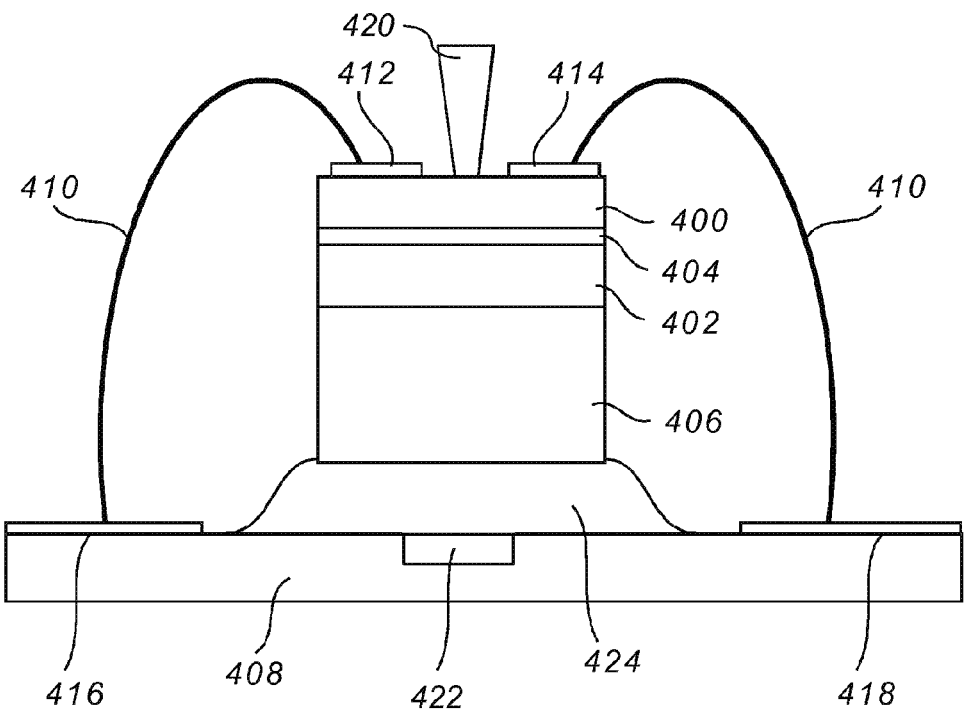
FIGS. 4A and 4B each illustrate a radiation source and reference detector of proximity sensors according to a first embodiment of the disclosure, wherein a reference detector is positioned underneath a VCSEL structure for detection of back emission illumination. The figures also illustrate embodiments of a radiation source according to an aspect of the disclosure.

FIG. 4A illustrates a first embodiment of the disclosure. This illustrates an "above-IC" VCSEL embodiment of the first aspect mentioned above, namely the co-location of a reference detector with a radiation source to receive back emission stray radiation. Electrodes 412, 414 are provided on the top surface over the VCSEL and coupled with bond pads 416, 418 via bond wires 410 in a similar manner to the structure described above with reference to FIG. 3. However, according to this embodiment, the VCSEL structure is modified. A first mirror 400 and second mirror 402 are provided on opposite sides of an active layer 404. The first mirror 400 may have less than 100% reflectivity, similar to that seen in FIG. 3, in order to encourage and tune the amount of forward emission. The second mirror 402 may optionally be modified so that it is has less than 100% reflectivity. This encourages back emission.

Figure 4B:
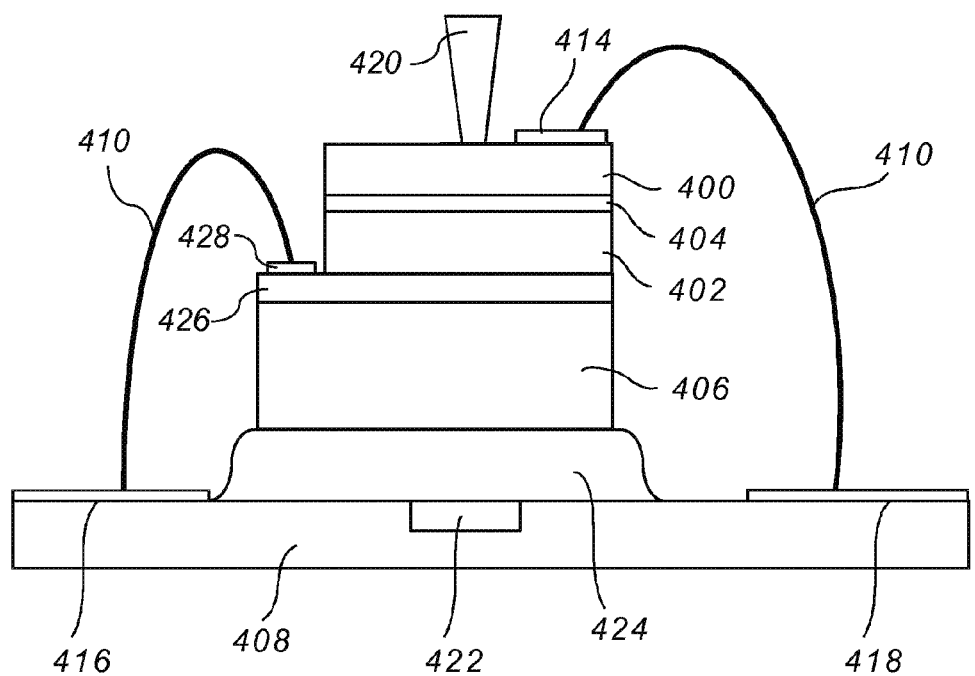
Figure 5:
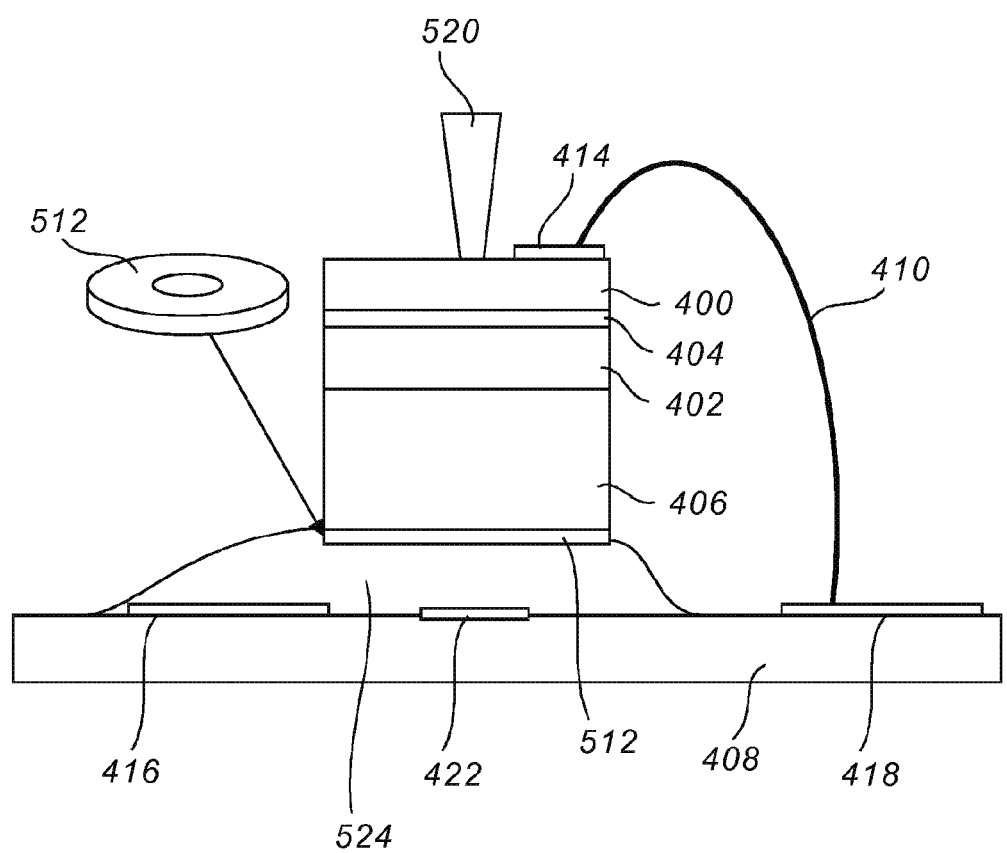
FIG. 5 illustrates a second embodiment of the disclosure, wherein an electrode is provided underneath a VCSEL structure and is shaped to allow the passage of light through to a detector provided underneath. The figure also illustrates a further embodiment of a radiation source according to an aspect of the disclosure.

A radiation source modified to encourage back emission represents a further aspect of the disclosure, and embodiments of this radiation source are illustrated in FIGS. 4A, 4B and 5. A radiation source according to this aspect of the disclosure may be used as a component part of proximity sensor or alternatively could be used for other purposes or as part of other types of device. A radiation source according to this aspect of the disclosure may comprise a VCSEL structure or an LED structure for example.

Turning back to the specific example of FIG. 4A, the opaque substrate 306 of the standard VCSEL structure shown in FIG. 3 may be replaced with a transparent substrate 406, which may be formed from a suitable glass or plastic material. Alternatively, the normally-opaque substrate 306 may be made at least partially transparent by reducing its thickness such that it becomes effectively transparent to the targeted radiation wavelength. The thickness may be reduced across the whole area of the VCSEL or at selected areas, for example by using the patterned electrode as a mask. This may result in a castellated structure for the substrate 306. Another alternative is to remove the opaque substrate 306 between the active layer and the bottom electrode, thus there is no remaining substrate 306 and the transparent substrate 406 is absent. Each of these approaches has the useful effect that back emission stray radiation may pass from the active layer down through the base of the VCSEL to the reference detector 422.

The VCSEL structure may optionally be mounted on an underlying substrate 408 using transparent glue or adhesive film 424. A suitable adhesive is Benzocyclobuten (BCB). Alternatively, molecular bonding of oxide to oxide or metal to metal may be used to attach the VCSEL structure onto the underlying substrate 408. A reference detector 422 can then be provided underneath the VCSEL structure 400-406. The reference detector 422 is an embedded photo detector able to detect and/or to measure the VCSEL radiation wavelength. Suitable detectors are for example photo-diodes, semiconductor junctions, SPADs (Single-Photon Avalanche Diodes) and SiPMs (Silicon PhotoMultipliers).

When the reflectivity of the bottom mirror 402 is adjusted to be less than 100%, the precise reflectivity may be tuned according to the structure of the laser and the desired light output. As an example, a real world "100%" reflective mirror may have a reflectivity of 99.9999% and this may be adjusted to have a reflectivity of 99.9% to allow more light to be emitted from the bottom of the VCSEL structure. As a further example, it has been found for an example structure that if the top mirror has a 97% reflectivity and allows 10 mW output, and an output of 0.1 nW is needed through back emission, then the bottom side reflectivity can be set at 99.97%.

In some cases, the bottom mirror may not even need to be modified, namely, it may have "100%" reflectivity. Because reflectivity is never in fact completely ideal, the very low transmittance that does in fact occur may in some cases be enough to ensure a back emission signal of sufficient magnitude is incident upon the reference detector, when an at least partially transparent substrate is used.

As before, the VCSEL emits a main beam 420, however, because both the upper mirror 400 and lower mirror 402 have been modified to have a less than 100% reflectivity, stray illumination will be emitted downwards, providing a signal that will be picked up at the detector 422 whenever the VCSEL fires. In the operation of the VCSEL structure shown in FIG. 3, there will be some emission of radiation in a downwards direction, known as back emission. This occurs because of the inevitable imperfections in reflectivity of the mirrors (as mentioned above, the "100%" reflectivity is an ideal that is not fully achievable). However in the modified design of FIG. 4, back emission is intentionally encouraged by the adjustment of the reflectivity of the upper and lower mirrors 400, 402.

The transparent glue 420 may also act to diffuse the back-emitted radiation. Metal particles can be incorporated or suspended in the glue for this purpose, which scatters light in all or random directions. This diffusion of the light can help compensate for any inaccuracy in the placement of the VCSEL structure over the reference detector 422. The glue positioning accuracy can also be improved by the use of a die attach film.

The reference detector 422 in this embodiment is provided underneath the VCSEL structure. This means that the size of an overall proximity sensor package can be reduced, as the reference detector 422 does not need to take up a further area of the substrate 408. The reference detector 422 may be fabricated to be embedded within the substrate 408, as shown in FIGS. 4a and 4B, or may be fabricated on or protruding from the upper surface of substrate 408.

FIG. 4B illustrates an alternative embodiment, being another variation of the first aspect mentioned above, namely the co-location of a reference detector with a radiation source. Features in common with the embodiment described in relation to FIG. 4A share the same numbering. In the embodiment of FIG. 4B, compared to that of FIG. 4A, instead of both electrodes being provided on the top surface over the VCSEL, the bottom layers of the VCSEL are contacted via a contact layer 426. Contact layer 426, which is supported by the underlying transparent substrate 406, extends laterally from the VCSEL stack 400-404. This allows a bottom electrode 428 (such as a cathode) to be made on the contact layer 426. The top electrode 414 and bottom electrode 428 are then coupled with bond pads 418, 416 via bond wires 410 in a similar manner to the structures described above with reference to FIGS. 3 and 4A.

As an alternative to wire bonding for the embodiments described herein, low-profile metal connectivity may be provided using wafer-level lithography or inkjet printing. Such fabrication methods give a very low profile construction that allows very thin package module construction. This allows automatic wafer-level testing and sorting (so-called Electrical Wafer Sorting) without needing equipment specific to the device being tested.

FIG. 5 illustrates an alternative embodiment, being another variation of the first aspect mentioned above, namely the co-location of a reference detector with a radiation source. Here, an electrode (for example a cathode) 512 is provided at a lower surface of the VCSEL structure, preferably on an underside surface of a transparent substrate 406, meaning that the cathodes 412 and 428 and associated wirebond 410 of FIGS. 4A and 4B respectively are dispensed with. The VCSEL structure can then be attached to the underlying substrate 408 via a transparent conductive glue or conductive epoxy 524, which provides an electrical connection between the cathode 512 and bond pad 416 in place of the previous bond wire 410. As an alternative to conductive glue, metal to metal direct bonding may be used to attach the VCSEL to the wafer substrate 408. Metal to metal soldering may alternatively be used.

The electrode may be formed from a suitable material that is both transparent and conductive, such as indium tin oxide (ITO) for example. Alternatively the electrode 512 may be formed of opaque material and shaped to have a transparent portion, for example, being annular in shape, as shown the illustrative example of the diagram, or may be shaped to have multiple holes, such as in a grid layout.

Thus, back emitted light from the VCSEL structure can pass through the electrode 512 or the transparent portion of the electrode 512 and through the transparent conductive epoxy 524 to be picked up by the detector 422. The conductive epoxy 524 may also act to diffuse the back-emitted radiation, for example, by having metallic particles incorporated or suspended within it. This diffusion of the light can help compensate for any inaccuracy in the placement of the VCSEL structure over the reference detector 422. The epoxy positioning accuracy can also be improved by the use of a die attach film applied over the substrate 408, reference detector 422 and bond pad 416 prior to deposit of the epoxy 524.

Figure 6:
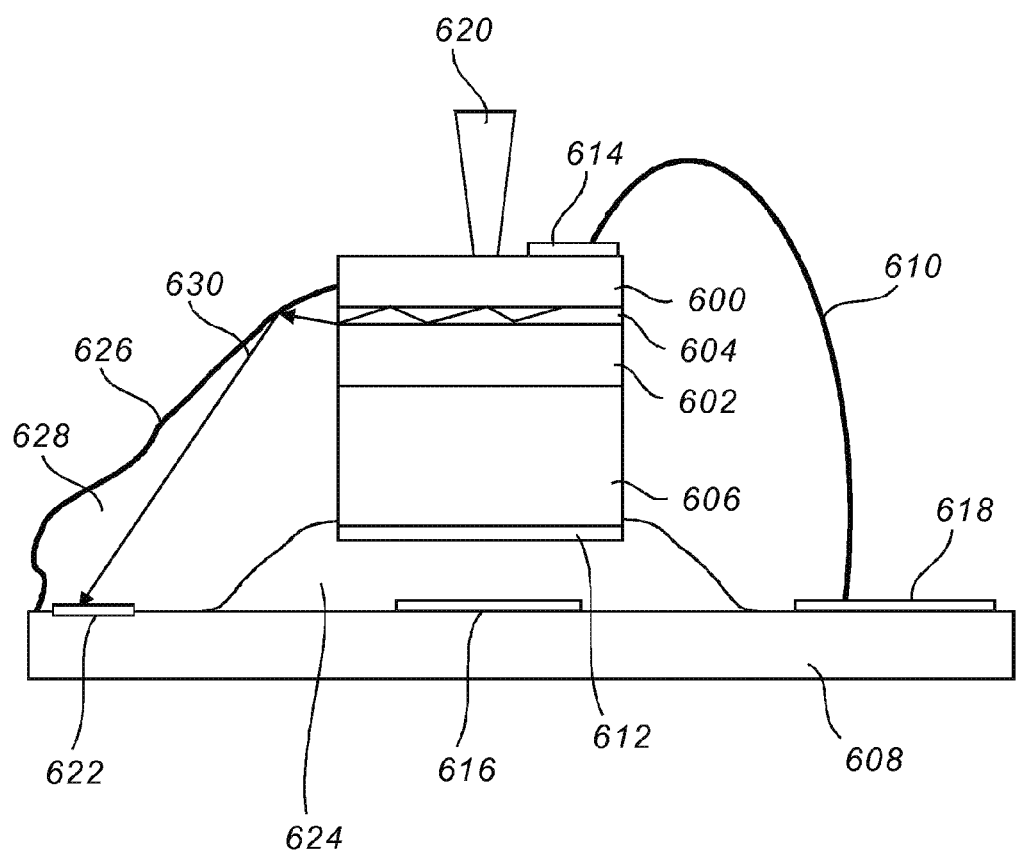
FIG. 6 shows a third embodiment of the disclosure, where a bond pad is provided underneath a VCSEL structure; a detector is provided beside a VCSEL structure and a reflective shielding is provided to direct side emitted light towards a reference detector.

FIG. 6 illustrates an alternative embodiment. This illustrates an embodiment of the second aspect mentioned above, namely the provision of a collection means for collection of side emission stray illumination and direction towards a reference detector. The illustrated example also provides for co-location of a bond pad for the radiation source with the radiation source itself, although it is to be appreciated that a top-side electrode could be provided, with a bond pad on the substrate beside the VCSEL structure instead.

Here, a VCSEL structure comprises a first mirror 600 having less than 100% reflectivity and a second mirror 602 of 100% reflectivity provided on opposite sides of an active layer 604. The reflectivity of the first mirror 600 may, as discussed above, be tuned to encourage forward emission, and may for example be at or around 97%. These components 600, 602, 604 are mounted on an opaque substrate 606. An anode 614 is coupled with a bond pad 618 via bond wire 610, again in a similar fashion to that illustrated in FIG. 3. A cathode 612 may be provided on an underside surface of a VCSEL structure, specifically, on an underside surface of the opaque substrate 606. It is electrically coupled to a bond pad 616 via conductive material 624, which may be a glue or epoxy resin for example. The structure is further provided with a shield member 626 defining a cavity 628 which may in one embodiment comprise or be filled with an optically conductive material, such as glue for example. Alternatively, the cavity 628 may be filled with air or another gas. The shield member 626 may also be provided with a reflective underside surface. The provision of the shield member 626 and cavity 628 means that stray illumination emitted from one side of the VCSEL structure is directed towards a detector 622. In particular, a significant source of stray illumination is light 630 that is reflected with in the active layer 604 and exits at the side of the active layer 604.

The reference detector 622 in this embodiment is also closer to the VCSEL structure as compared with the arrangement of FIG. 3, because one of the bond wires 310 of FIG. 3 has been dispensed with and the bond pad that was at the side of the reference detector has been moved from a position on the die that is spaced from the VCSEL structure to a position co-located with the VCSEL structure, being provided below it in this example. Therefore the size of an overall proximity sensor package comprising a structure as shown in FIG. 6 can be reduced as compared with the a size of an overall package comprising the structure shown in FIG. 3.

Figure 7:
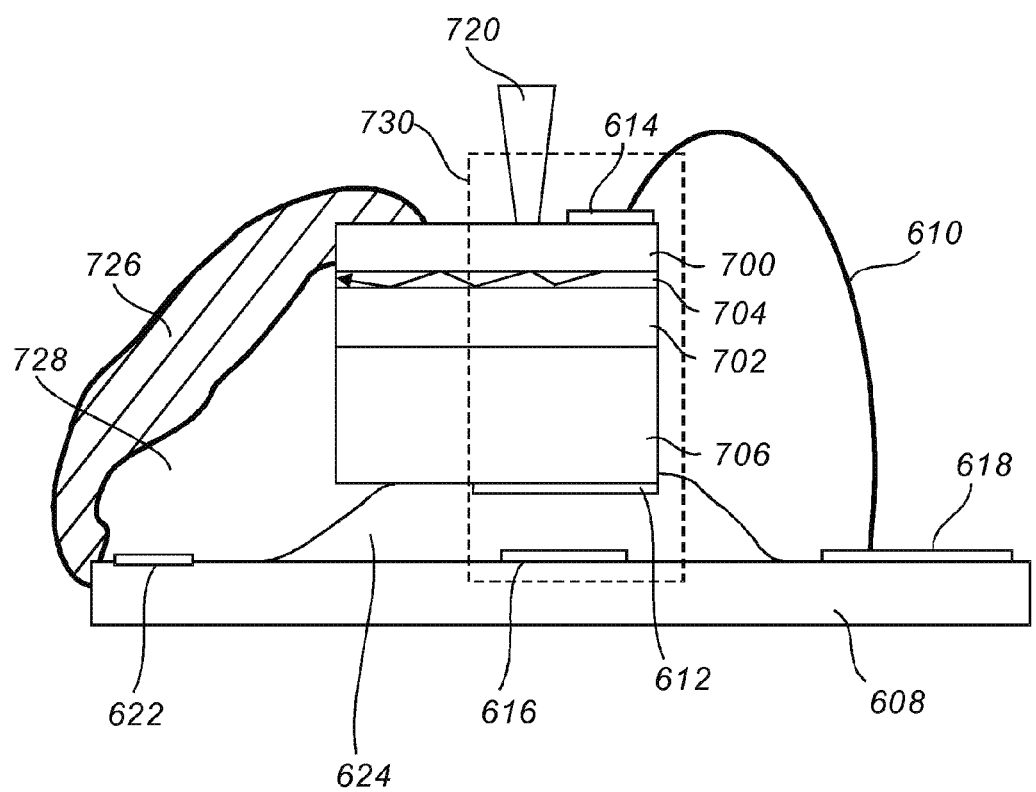
FIG. 7 illustrates a fourth embodiment of the disclosure, where a bond pad is provided underneath a VCSEL structure and wherein, relative to the structure of the third embodiment, the VCSEL structure is extended and shielding is increased to deflect side emitted illumination towards the detector.

FIG. 7 illustrates a further embodiment of the disclosure, representing a variation of the embodiment illustrated in FIG. 6, and being a further example of the second aspect mentioned above, namely the co-location of a bond pad for the radiation source with the source itself. FIG. 7 also illustrates a further example of a collection means which collects stray radiation and preferably also directs it towards the reference detector. Here, the VCSEL structure comprises a first mirror layer 700 having a less than 100% reflectivity and a second mirror layer 702 having a 100% reflectivity provided on opposite sides of an active layer 704 and mounted upon an opaque substrate 706. The VCSEL functionality of the structure 700-706, is similar to the structure 600-606 illustrated in FIG. 6. However in this embodiment, the widths of the various layers 700 through 706 are intentionally increased. In effect, the structure may be considered to have a VCSEL active area generally illustrated by the dotted line 730 and an extended portion. As for the structure shown in FIG. 6, a cathode 612 is provided on an underside surface of the VCSEL structure, specifically at an underside surface of the opaque substrate 706, and is electrically coupled with a bond pad 616 via a layer of conductive material 624, which may for example be glue or epoxy resin.

In the embodiment of FIG. 7, shielding 726 is provided defining a cavity 728 which may be filled with an optically conductive material. Alternatively, the cavity 728 may be filled with air or another gas. The shielding 726 may be, for example, made of a black material, such as black plastic or reflective chromium for example. The extended portion of the VCSEL structure provides a surface around which the shielding 726 can be molded. The shielding 726 may also be provided with a reflective underside surface. The provision of the shielding 726 and cavity 728 means that stray illumination emitted from one side of the VCSEL structure is directed towards a detector 622. In particular, a significant source of stray illumination is light 630 spontaneously emitted from the active layer and reflected within the active layer, which therefore exits at the side of the active layer.

Although the extension of the VCSEL structure means that the size of the structure shown in FIG. 7 is comparatively larger than the structure shown in FIG. 6, the size of an overall proximity sensor package comprising a structure as shown in FIG. 7 can still be reduced as compared with the a size of an overall package comprising the structure shown in FIG. 3.

When a source die is mounted (and electrically connected) on a proximity sensor wafer, the source can be tested using wafer level test.

Wafer-level test of a source die mounted on a wafer can be done in the following ways:

(A) Using a detector (the reference detector) located where it can pick up stray radiation from the source as soon as the source is mounted on the wafer and electrically connected, as described embodiments illustrated by FIGS. 4A to 7.

(B) Using a photodiode on the probe card to pick up radiation from the source. However, this only tests that the source emits.

(C) Using a mirror or other surface on the probe card to reflect or otherwise direct light from the source back to a detector on the wafer next to the source. This method of wafer-level test would work with the device of FIG. 3 (if wafer mounted) as well as the devices of FIGS. 6 and 7. However, the mirror would either be in the wrong place or so close that only the reference detector could be detected.

Compared to (B) and (C), (A) is a better wafer-level test because it tests all of the following: that the source is emitting; that stray light is being correctly emitted; that the stray light is reaching the detector; and that the detector itself is functioning. Furthermore, (A) is better because it uses standard probe cards.

The embodiments described herein provide for an early test of the VCSEL and detector together, that can be done in the product fabrication flow, without VCSEL assembly complications.

Compared to the approach of FIG. 3, there are several advantages of one or more of the embodiments described herein:

(1) Stray radiation detection does not need to take radiation from the main beam so increases the amount of radiation that is available for transmission and subsequent reflection from an object, leading to improved accuracy.

(2) The reference detector under (FIGS. 4A, 4B, 5) or very close to (FIGS. 6, 7) the source (e.g VCSEL) leads to a small package, which leads to better integration with other devices.

(3) Mounting the radiation source on an underlying substrate which carries the reference detector allows better testing. Because the radiation source is on a wafer, then wafer level testing of the emission from the source is possible. When combined with stray light detection by the reference detector (either directly as illustrated in FIGS. 4A, 4B and 5, or aided by shielding as illustrated in FIGS. 6 and 7) then not only the emission function of the source can be tested at wafer level, but also the function of the detector and also the stray light transmission from the radiation source to the reference detector. Thus, there is no need to saw the wafer substrate then assemble the package to provide reflection from the source via the underside surface of the assembled cover to the reference detector.

(4) Low profile metal connectivity when mounting the radiation source on an underlying substrate which carries the reference detector leads to a low profile and a thin package, which in turn allows wafer-level test without needing specific equipment.

These embodiments also provide for better integration with other devices, because of the reduced real-estate requirement and because the VCSEL is mounted on the wafer.

Figure 8:
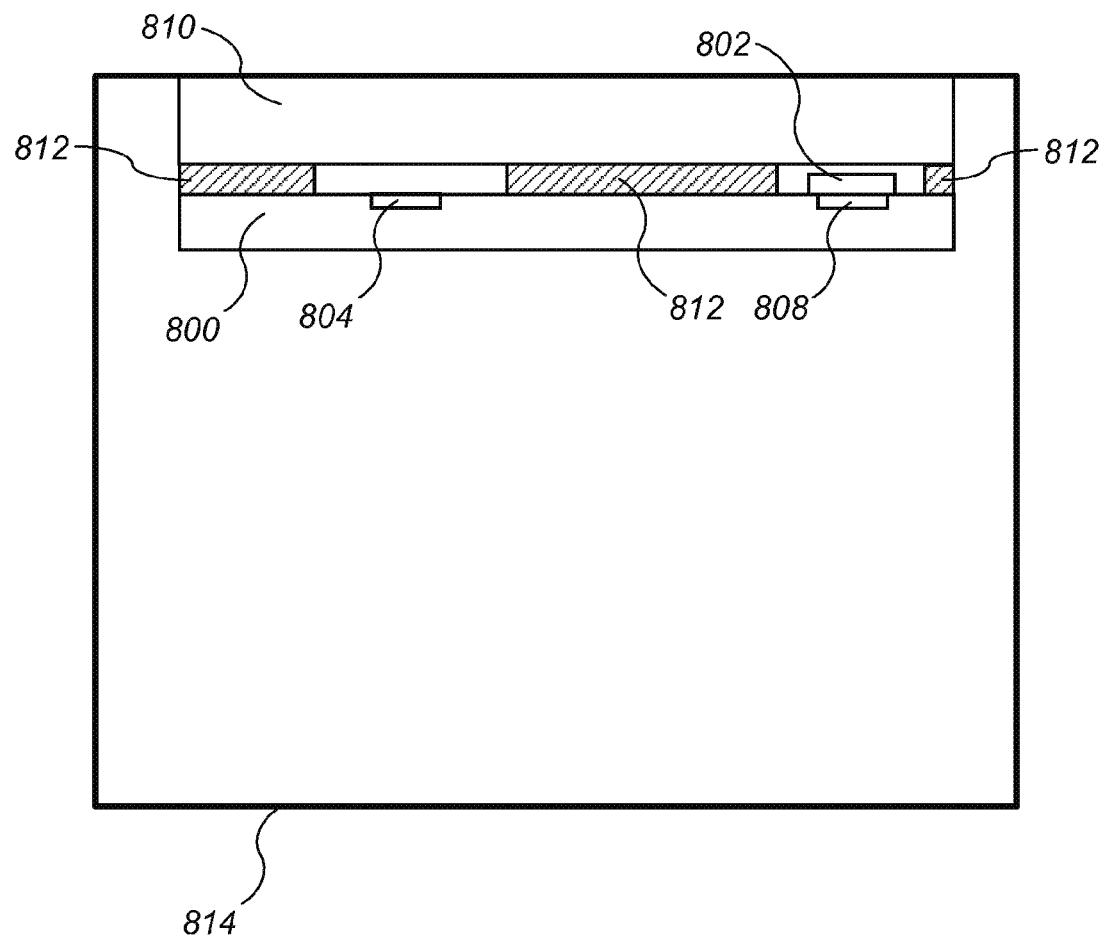
FIG. 8 illustrates an electronic device having a proximity sensor according to embodiments of the disclosure.

FIG. 8 illustrates an electronic device having a proximity sensor according to embodiments of the disclosure. The proximity sensor has a substrate 800 and is of the type comprising a VCSEL radiation source 802 for emitting a primary radiation beam and a primary detector 804 for picking up a reflected primary radiation beam. The proximity sensor has a reference detector 808 arranged to receive stray radiation emitted from the VCSEL radiation source 802. This arrangement, including the configuration of the VCSEL 802 above the reference detector 808, allows a simple integrated package. A single transparent protective layer 810 is provided upon opaque material 812 to optically isolate the source 802 from the primary detector 804. The electronic device 814 may be for example a mobile telephone, a laptop, a gesture recognition device or portable rangefinder.

Examples of the embodiments described herein may provide a VLSI-matched time reference for ranging applications based on light time of flight (TOF) measurement while saving silicon area and removing some package constraints.

As mentioned above, the disclosure is not restricted to any particular type of radiation source. The embodiments mentioned above make reference to VCSEL radiation sources, although it is to be appreciated that an LED radiation source may alternatively be applied. In particular, a surface emitting LED may have differently doped layers with an active layer interposed between them (for example, with reference to FIG. 4, layer 400 could comprise semiconductor material with one or more n-doped layers and layer 402 could comprise semiconductor material with one or more p-doped layers, which structure provides an active region 404). An LED radiation source according to the disclosure may also comprise a resonant cavity. In that case, for example, with reference to FIG. 4, the layer 400 could comprise semiconductor material with one or more n-doped layers and a Bragg reflector and layer 402 could comprise semiconductor material with one or more p-doped layers and a Bragg reflector, and layer 404 (or part thereof) may comprise an active region). The features of the embodiment of FIG. 4, and all other embodiments may be applied equally for the case of an LED as for a VCSEL, unless specifically precluded by the context of the relevant part of the disclosure.

Various improvements and modifications can be made to the above without departing from the scope of the invention as may be derived from the disclosure herein.

What is claimed is:

1. A proximity sensor, comprising:
   a substrate;
   a radiation source mounted on the substrate and configured to emit a primary radiation beam;
   a primary detector mounted on the substrate and configured to detect a reflection of said primary radiation beam off an object spaced apart from the proximity sensor by a distance;
   a reference detector mounted on the substrate, co-located with the radiation source and configured to detect back emission stray radiation emitted from the radiation source; and
   a time-digital converter coupled to the primary detector and reference detector, the time-digital converter configured to determine the distance as a function of an elapsed time between detection of the back emission stray radiation and detection of the reflection of the primary radiation beam off the object.

2. The proximity sensor of claim 1, wherein the radiation source comprises a vertical cavity surface emitting laser (VCSEL) comprising a first mirror and a second mirror provided at respective upper and lower sides of an active layer and wherein the back emission stray radiation is emitted from the VCSEL.

3. The proximity sensor of claim 2, wherein the second mirror is designed to have a lower than 100% reflectivity in order to encourage back emission stray radiation.

4. The proximity sensor of claim 1, wherein a conductive material is provided to affix the radiation source to the substrate which carries the reference detector, said conductive material being formed to provide an electrical coupling between the radiation source and a bond pad which is carried on the substrate.

5. The proximity sensor of claim 1, wherein the radiation source also comprises an at least partially transparent substrate.

6. The proximity sensor of claim 1, wherein a transparent glue is provided to affix the radiation source to the substrate.

7. The proximity sensor of claim 1, wherein the radiation source is provided with a first electrode at an upper surface, and a second electrode at a lower surface, said second electrode being formed from an optically transparent material.

8. The proximity sensor of claim 1, wherein the radiation source is provided with a first electrode at an upper surface, and a second electrode at a lower surface, said second electrode being shaped to have a transparent portion configured to pass back emission stray radiation.

9. The proximity sensor of claim 8, wherein said second electrode has an annular or grid shape.

10. The proximity sensor of claim 1, wherein the radiation source comprises a light emitting diode (LED).

11. An apparatus, comprising:
a radiation source mounted on a substrate and configured to emit a primary radiation beam at an object spaced apart from the apparatus by a distance, the radiation source comprising:
a first mirror and a second mirror provided at respective upper and lower sides of an active layer;
wherein reflectivity of said first and second mirrors permits back emission of radiation towards the substrate;
a primary detector mounted on the substrate and configured to detect a reflection of the primary radiation beam off an object spaced apart from the apparatus;
a reference detector mounted on said substrate and configured to detect said back emission of radiation; and
a time-digital converter coupled to the primary detector and reference detector, the time-digital converter configured to determine the distance as a function of an elapsed time between detection of the back emission of radiation and detection of the reflection of the primary radiation beam off the object.

12. The apparatus of claim 11, wherein the radiation source comprises a vertical cavity surface emitting laser (VCSEL).

13. The apparatus of claim 11, wherein the second mirror is designed to have a reflectivity of less than 100%.

14. The apparatus of claim 13, wherein a reflectivity of the first mirror is less than the reflectivity of the second mirror.

15. The apparatus of claim 11, further comprising an at least partially transparent substrate upon which said first mirror, active layer and second mirror are provided.

16. The apparatus of claim 11, further comprising an electrode beneath a structure comprising said first mirror, active layer and second mirror.

17. The apparatus of claim 16, wherein the electrode is formed of a material that is both transparent and electrically conductive.

18. The apparatus of claim 16, wherein the electrode is shaped to include an aperture or a transparent portion.

19. The apparatus of claim 11, further comprising a light emitting diode (LED).

* * * * *